United States Patent
Wong et al.

(10) Patent No.: US 7,167,055 B2
(45) Date of Patent: Jan. 23, 2007

(54) VOLTAGE LEVEL DETECTOR FOR POWER AMPLIFIER PROTECTION CONTROL

(75) Inventors: Shiah Siew Wong, Singapore (SG); Yasuo Higuchi, Singapore (SG)

(73) Assignees: Matsushita Electric Industrial Co., Ltd., Osaka (JP); Panasonic Semiconductor Asia Pte Ltd., Singapore (SG)

( * ) Notice: Subject to any disclaimer, the term of this patent is extended or adjusted under 35 U.S.C. 154(b) by 0 days.

(21) Appl. No.: 11/331,192

(22) Filed: Jan. 13, 2006

(65) Prior Publication Data

US 2006/0119434 A1   Jun. 8, 2006

Related U.S. Application Data

(62) Division of application No. 10/824,659, filed on Apr. 15, 2004, now Pat. No. 7,030,700.

(51) Int. Cl.
*H03F 1/52* (2006.01)
(52) U.S. Cl. ........................ 330/298; 330/51

(58) Field of Classification Search ............... 330/51, 330/207 P, 298
See application file for complete search history.

(56) References Cited

U.S. PATENT DOCUMENTS

| | | | |
|---|---|---|---|
| 3,898,532 A | 8/1975 | Frank | |
| 4,053,996 A | 10/1977 | Schertz et al. | |
| 4,355,341 A | 10/1982 | Kaplan | |
| 4,402,029 A | 8/1983 | Fujita | |
| 5,543,760 A | 8/1996 | Honda et al. | |
| 5,847,610 A | 12/1998 | Fujita | |
| 6,525,605 B1 * | 2/2003 | Hu et al. ............ | 330/132 |

FOREIGN PATENT DOCUMENTS

| | | |
|---|---|---|
| JP | 6-350349 A | 12/1994 |
| JP | 6-350350 A | 12/1994 |

* cited by examiner

*Primary Examiner*—Robert Pascal
*Assistant Examiner*—Hieu Nguyen
(74) *Attorney, Agent, or Firm*—McDermott Will & Emery LLP

(57) ABSTRACT

A voltage level detector (8) which activates itself by monitoring the voltage level ($V_{STB}$) at a standby pin (5) during power-up of an audio power amplifier (10), and can detect fault conditions of an output block (2), such as a short to ground at an output terminal (3), in contrast to conventional protection circuits that can operate only after power-up.

8 Claims, 10 Drawing Sheets

VOLTAGE LEVEL DETECTOR FOR POWER AMPLIFIER PROTECTION CONTROL

This application is a divisional of application Ser. No. 10/824,659, filed on Apr. 15, 2004, now U.S. Pat. No. 7,030,700, the disclosure of which Application is incorporated by reference herein.

BACKGROUND OF THE INVENTION

The present invention relates to a power amplifier, especially protection for a power amplifier against fault conditions.

In a power amplifier system, it is desirable to avoid operation in fault modes, which could result in permanent damage of the system, especially power transistors. With designed protection circuits, the system may recover from fault conditions and resume normal operation without suffering any damage. In a conventional design, the protection circuits protect the power amplifier against any of the following fault conditions: a short at an output terminal to ground, a power supply, or another output terminal; an overload on the power output; an over-, or under-voltage of the power supply; overheating of the package. An example of such protection circuits is disclosed in U.S. Pat. No. 4,053,996.

FIG. 9 is a block diagram showing the protection for a conventional audio power amplifier. The power amplifier comprises an output block 2, an output terminal 3, a bias block 4, a standby pin 5, and a protection block 70.

The output block 2 includes two power transistors in series between a power supply (with a voltage $V_{CC}$) and a ground. The output terminal 3 is connected between the two power transistors. The bias block 4 provides bias currents for other blocks, thereby biasing the other blocks in activated states, especially the two power transistors conductive. Then, a large amount of current flows through the power transistors and the output terminal 3, and thus power is provided for an outside load, such as a loudspeaker (not shown).

The protection block 70 includes a protection switch block 71, an ASO (Area-of-Safe-Operation) monitoring block 72, and a short-to-ground detection block 73. The protection switch block 71 controls the ON/OFF states of protection switches 7A, which are interposed between the output block 2 and the bias block 4, and allow (or prohibit) bias currents to flow (or from flowing, respectively). The ASO monitoring block 72 is designed to detect the operations of the power transistors outside their ASO. Here, the operations outside the ASO indicate an occurrence of the above-listed fault conditions of the power transistors, such as "a short to ground, power supply, or another output terminal" and "an overload". The ASO monitoring block 72 monitors the operation of the output block 2 through the currents, voltages, and temperatures of the power transistors. When the currents or voltages exceed the limits of the ASO, which depends on the temperature, the ASO monitoring block 72 sends a signal to the protection switch block 71 (usually after a predetermined delay $T_D$ in order to avoid misoperations). Then, the protection switch block 71 turns off the protection switches 7A, and thus cuts off the bias currents for the output block 2. Accordingly, the power transistors are both confined in the OFF states regardless of the fault types. At the same time, the protection switch block 71 connects the short-to-ground detection block 73 to the bias block 4. Then, the short-to-ground detection block 73 is activated and monitors the potential of the output terminal 3 with respect to a ground. In the event of a short to ground at the output terminal 3, the short-to-ground detection block 73 continuously sends a signal to the protection switch block 71. Thereby, the protection switch block 71 maintains the protection switches 7A in the OFF states. Thus, the protection block 70 prevents permanent damage to the power transistors due to an overcurrent. When the short to ground is not detected or removed, the short-to-ground detection block 73 terminates the sending of the signal. Then, the protection switch block 71 turns on the protection switches 7A, thereby allowing the bias currents to flow to the output block 2. Thus, the power transistors are released and the power amplifier recovers the normal operation.

The above-described protection for the power transistors is effective during the normal operation of the power amplifier, since the currents and voltages of the output block 2 is so large that the ASO monitoring block 72 can easily and promptly detect the operation of the power transistors outside the ASO. However, a problem arises when a fault condition, for example, a short to ground at the output terminal 3 occurs during power-up as follows.

FIG. 10 is a timing chart showing the operations of the protection switches 7A, the protection switch block 71, the ASO monitoring block 72, and the short-to-ground detection block 73 during power-up, together with the level of the voltage $V_{STB}$ at the standby pin 5 (see FIG. 9). In FIG. 10, high (or low) levels represent activated (or non-activated) states of the respective blocks. Here, the voltage $V_{STB}$ at the standby pin 5 is supplied by an external device, such as a microcontroller, and its level rises at a predetermined rate during power-up. The bias block 4 monitors the level of the voltage $V_{STB}$ during power-up, and does not provide the bias currents for the protection block 70 until the standby pin 5 is enough activated, that is, the level of the voltage $V_{STB}$ reaches a predetermined level $V_{ON}$. Thereby, the protection block 70 avoids misoperations due to inrush currents and abrupt voltage rises. In particular, an audio power amplifier prevents a loudspeaker from reproducing an undesired noise (which is known as "popping noise") at power-up. The arrangement of the standby pin 5 is an ordinary component of prior-art power amplifiers, especially audio power amplifiers.

The protection block 70 is maintained in a non-activated state after the time T0 when power-up starts, until the time $T_{ON}$ when the voltage level $V_{STB}$ of the standby pin 5 reaches the predetermined level $V_{ON}$. Accordingly, the ASO monitoring block 72 cannot detect the operations of the power transistors outside the ASO during the period from the time T0 to the time $T_{ON}$. Therefore, the protection switches 7A are maintained in the ON states during a period PON from the time T0 to the time when the delay $T_D$ has elapsed from the time $T_{ON}$. As such, in the event of a short to ground at the output terminal 3 at power-up, excessive currents may flow through the power transistors in the period PON, and a large amount of power may be dissipated in the power transistors. Unless removed within a very short period of time, this dissipation may cause permanent damages to the power transistors, and hence the power amplifier. Since the protection block 70 cannot promptly react to fault occurrences during power-up, it is difficult to reduce the risk of permanent damages to the power transistors.

In order to activate the protection block 70, especially the ASO monitoring block 72, at an earlier stage during power-up, the ASO monitoring block 72 is required to enlarge its detection range and enhance its detection accuracy, thereby ensuring its reliability during power-up. However, the ASO of the power transistor is tightly confined since the output block 2 is usually designed to have a size large enough to deliver sufficient power, while minimizing its chip area. Accordingly, the detection accuracy required of the ASO monitoring block 72 is very high for the normal operation of the power amplifier. In addition, when the power amplifier is designed as a monolithic IC, an area available for implementation of the ASO monitoring block 72 in itself is tightly confined. On the other hand, there is a limit to the accuracy of the design of the ASO monitoring block 72 due to parameter tolerances of wafer process. In a conventional design, the detection range of the ASO monitoring block 72 is confined to cover the operation ranges of the power transistors during the normal operation, thereby ensuring high accuracy of detection. Therefore, it is difficult for the ASO monitoring block 72 to achieve a larger detection range with higher detection accuracy suitable for a reliable protection for the output block 2 during power-up.

SUMMARY OF THE INVENTION

An object of the present invention is to provide a power amplifier protecting its output block including a power transistor against damages due to fault conditions during power-up, while not affecting its original performance.

According to the present invention, a power amplifier comprises a voltage level detector for protection control. Here, the power amplifier preferably comprises:

an output block including power transistor and an output terminal connected to a load;

a bias block including a standby pin and being allowed to bias other blocks of the power amplifier in activated states, especially the power transistor conductive, when the standby pin stays active;

a ASO monitoring block for detecting the operations of the power transistor outside their ASO (Area of Safe Operation) and issuing a cutoff signal;

a first fault detection block for detecting fault conditions of the power transistor and the output terminal and issuing the cutoff signal; and a protection switch block for cutting off the output block from the bias block and connecting the first fault detection block to the bias block during reception of the cutoff signal.

The voltage level detector according to the present invention preferably comprises:

a second fault detection block for monitoring the voltage level at the standby pin during power-up, and upon detection of the voltage level reaching a threshold level, detecting fault conditions of the power transistor and the output terminal; and a cutoff signal generating block for issuing the cutoff signal when the second fault detection block detects a fault condition of one of the power transistor and the output terminal.

During power-up of the power amplifier until the standby pin is activated, the bias block does not bias the ASO monitoring block in the activated state. The voltage level detector itself monitors the voltage level of the standby pin, and thereby starts up at an earlier stage than the startup of the ASO monitoring block, thus being able to detect the fault conditions at an earlier stage than the detection of the ASO monitoring block. In the event of a fault condition, such as a short to ground at the output terminal, during power-up, the voltage level detector can activate the protection switch block using the cutoff signal, then cutting off the power transistor from the bias block at the earlier stage of power-up. Thus, the power amplifier can protect the output block against permanent damages due to fault conditions during power-up.

The voltage level detector according to the present invention may further comprise:

a recovery block for monitoring the voltage level at the standby pin during power-up, and upon detection of the voltage level reaching a second threshold level, causing the cutoff signal generating block to terminate issue of the cutoff signal.

When the voltage level detector detects a fault condition and activates the protection switch block during power-up, the protection switch block connects the first fault detection block to the bias block, then activating the first fault detection block. In case where the detected fault condition truly occurs and lasts, the first fault detection block surely detects the fault condition and causes the protection switch block to maintain the cutoff of the output block from the bias block. On the other hand, when the fault condition detected by the voltage level detector is not the actual condition or removed, the first fault detection block does not detect the fault condition. Moreover, the voltage level detector releases the protection switch block when the voltage level of the standby pin reaches the second threshold level, regardless of the fault occurrence. Therefore, the power amplifier promptly recovers the normal operation. Thus, the voltage level detector avoids affecting the original performance of the power amplifier.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DETAILED DESCRIPTION OF THE INVENTION

The following explains the best embodiment of the present invention, referring to the figures.

Figure 1:
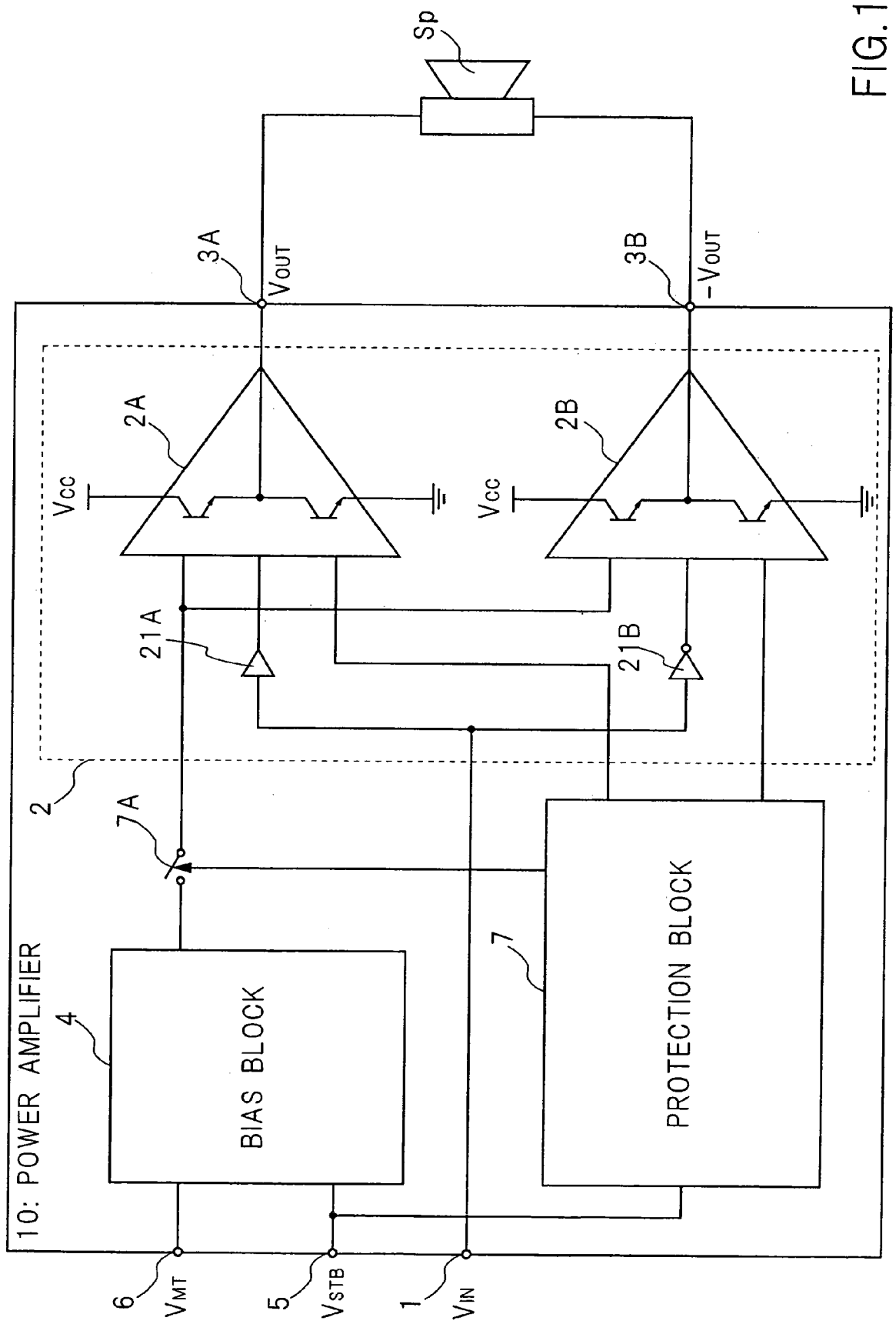
FIG. 1 is a block diagram showing the BTL (Balanced Transformer Less) configuration of a power amplifier 10 of Embodiment according to the present invention.

FIG. 1 shows the BTL configuration of a power amplifier 10 of Embodiment according to the present invention. The power amplifier 10 is preferably an audio power amplifier for driving a loudspeaker Sp. The power amplifier 10 comprises an input terminal 1, an output block 2, first and second output terminals 3A and 3B, a bias block 4, a standby pin 5, a mute pin 6, and a protection block 7.

The input terminal 1 receives audio signals VIN from an outside device, for example, a microcontroller. The output block 2 includes first and second operational amplifiers 2A and 2B, a buffer 21A, and an inverter 21B. The audio signals VIN pass through the buffer 21A and the inverter 21B, and enter the first operational amplifier 2A and the second operational amplifier 2B, respectively, in opposite phases. The first and second operational amplifiers 2A and 2B are a push-pull type, that is, each of them includes a pair of power transistors connected in series between a power supply (with a voltage VCC) and a ground. The first and second output terminals 3A and 3B intermediate between the respective pairs of the power transistors are connected across the loudspeaker Sp. The first and second operational amplifiers 2A and 2B transform the audio signal VIN to a pair of output voltages VOUT and −VOUT in opposite polarities at the first and second output terminals 3A and 3B, respectively. Then, double the output voltage VOUT is applied across the loudspeaker Sp.

The bias block 4 provides bias currents for other blocks, thereby biasing the other blocks in activated states, especially the power transistors conductive. The bias block 4 monitors the states of the standby pin 5 and the mute pin 6, and starts (or terminates) the biasing on activation of the standby pin 5 (or the mute pin 6, respectively). Here, the voltage levels $V_{STB}$ and $V_{MT}$ at the standby pin 5 and the mute pin 6, respectively, are controlled by an outside device, for example, a microcontroller. For example, the voltage level $V_{STB}$ at the standby pin 5 is set at 0V and +5V in operation and standby modes, respectively. In particular, the voltage level $V_{STB}$ at the standby pin 5 rises at a predetermined rate during power-up. The bias block 4 provides bias currents for the protection block 7 on detection the voltage level $V_{STB}$ reaching a predetermined level $V_{ON}$. Thereby, the protection block 7 avoids misoperations due to inrush currents and abrupt voltage rises, and in particular, prevents the loudspeaker Sp from reproducing a "popping noise" at power-up.

The protection block 7 detects fault conditions of the output block 2. The fault conditions include, for example, a short at one of the output terminals 3A and 3B to ground, the power supply, or the other of the output terminals; an overload on power output; an over-, or under-voltage of the power supply; and an overheating of the package. On detection of the fault conditions, the protection block 7 turns off a protection switch 7A, thereby cutting off the output block 2 from the bias block 4. Accordingly, the output block 2 is prevented from maintaining the conductive state under the fault conditions, and thus protected against permanent damage due to the fault conditions. In contrast to the prior art, the protection block 7 itself monitors the state of the standby pin 5 and thereby protects the output block 2 during power-up of the power amplifier 10 as described later.

Figure 2:
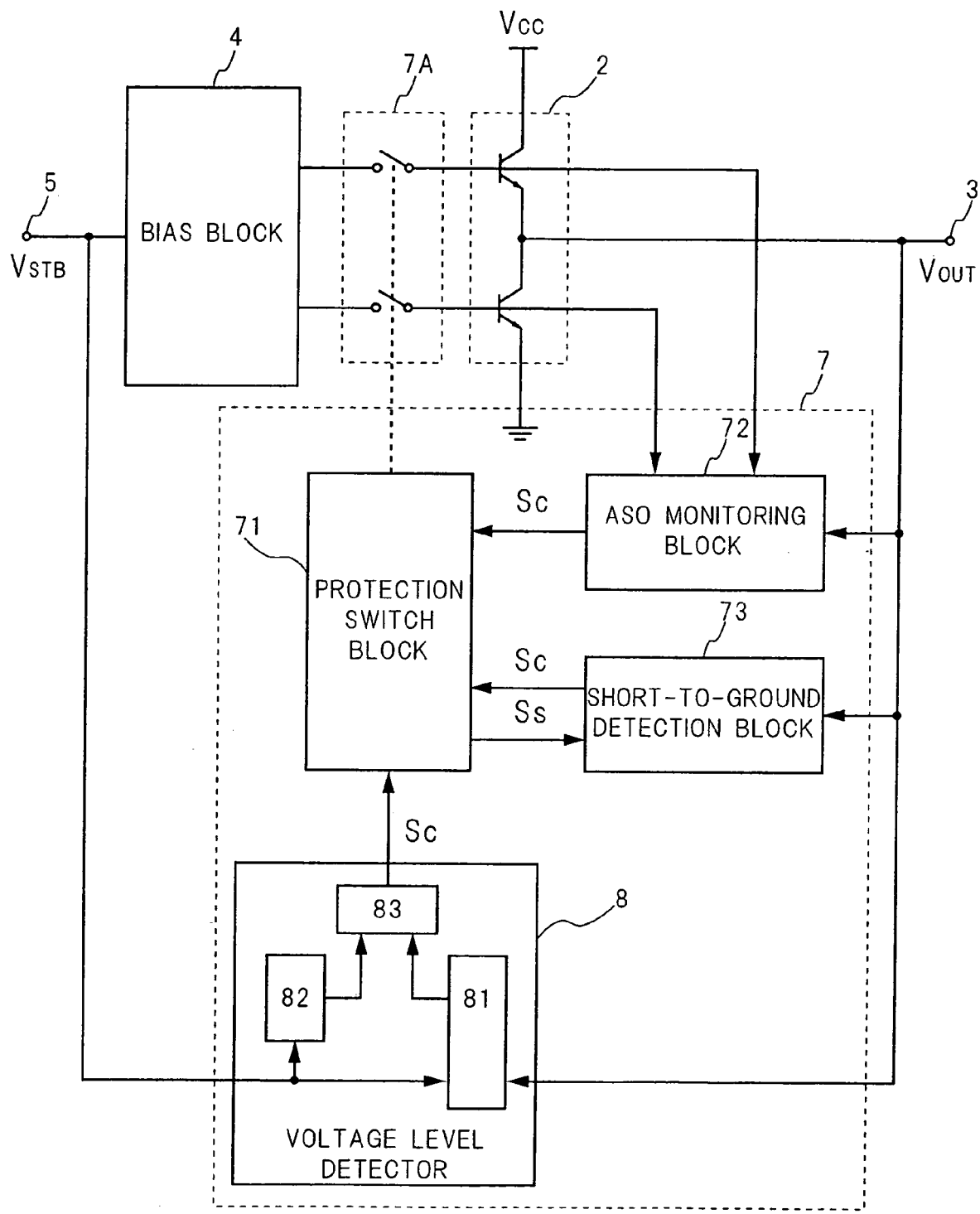
FIG. 2 is a block diagram showing the configuration of the power amplifier 10 aimed at protection for an output block 2.

FIG. 2 shows the configuration of the power amplifier 10 aimed at protection for the output block 2. The protection block 7 includes a protection switch block 71, an ASO monitoring block 72, a first short-to-ground detection block 73, and a voltage level detector 8.

The protection switch block 71 controls the ON/OFF states of protection switches 7A, which are interposed between the output block 2 and the bias block 4, and allow (or prohibit) bias currents to flow (or from flowing, respectively). In particular, on reception of a cutoff signal Sc issued by other blocks in the protection block 7, the protection switch block 71 turns off the protection switches 7A and sends a startup signal Ss to the first short-to-ground detection block 73. Moreover, on halt of the cutoff signal Sc, the protection switch block 71 turns on the protection switches 7A.

Figure 3:
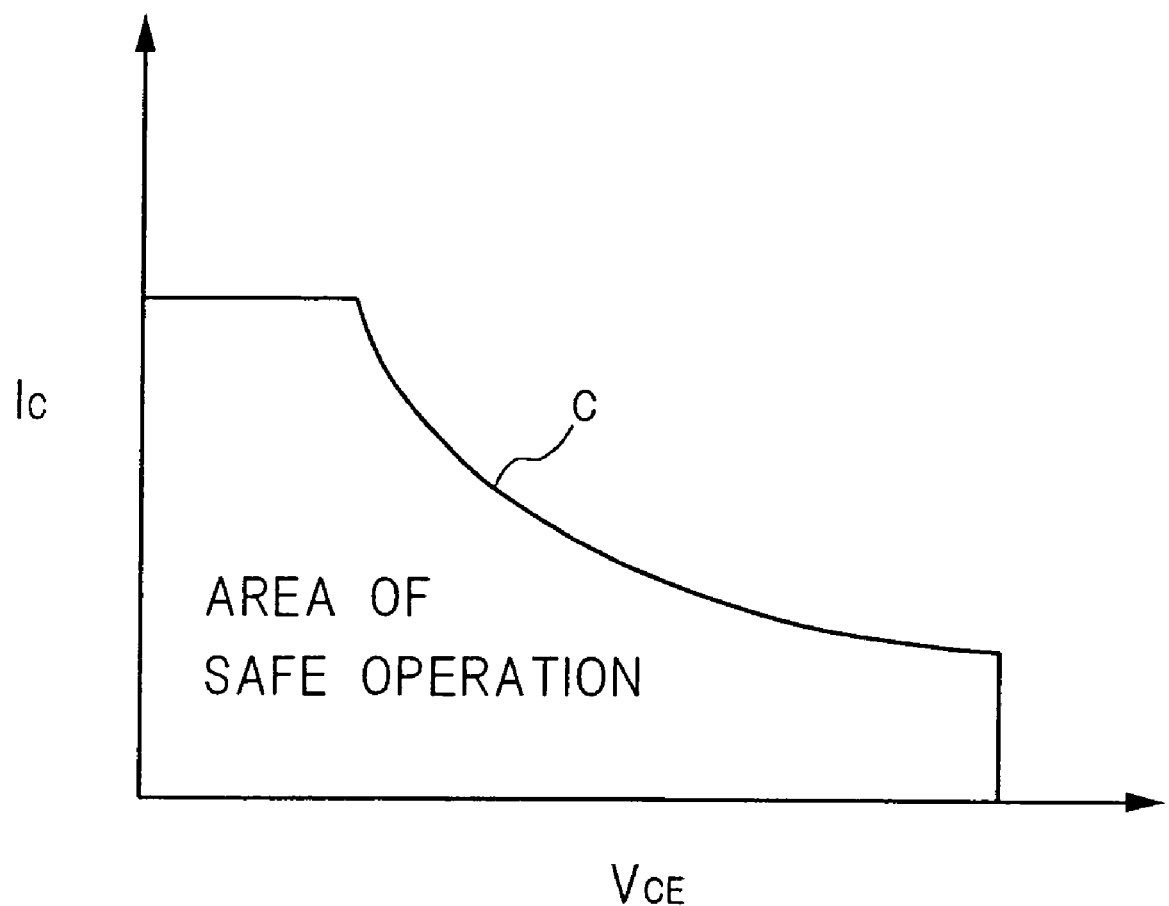
FIG. 3 is a graph showing a typical ASO of a power transistor as a relation between its collector currents $I_C$ and its collector-emitter voltages $V_{CE}$.

The ASO monitoring block 72 detects the operations of the power transistors outside their ASO. Since the output block 2 is designed to operate within the determined ASO, the operations outside the ASO indicate occurrences of the fault conditions of the power transistors. FIG. 3 shows a typical ASO of the power transistors as a relation between the collector currents $I_C$ and the collector-emitter voltages $V_{CE}$ (in the case of MOSFETs, the drain currents and the drain-source voltages, respectively). The curve C represents the limits of the ASO, which is determined by, for example, the upper limits of the collector current $I_C$, the collector-emitter voltage $V_{CE}$, and dissipation allowable to suppress the temperature rise at the junction in the power transistor. The ASO monitoring block 72 monitors the currents, voltages, and temperatures of the power transistors. When the currents or voltages exceed the limits of the ASO, which depend on the temperatures, the ASO monitoring block 72 sends the cutoff signal Sc to the protection switch block 71, usually after a predetermined delay $T_D$ in order to avoid misoperations.

The first short-to-ground detection block 73 is connected to the bias block 4 on reception of the startup signal Ss issued by the protection switch block 71. Then, the first short-to-ground detection block 73 is activated and monitors the potential of the output terminal 3 with respect to the ground. In the event of a short to ground at the output terminal 3, the first short-to-ground detection block 73 continues to send the cutoff signal Sc to the protection switch block 71. When the short to ground is not detected or removed, the first short-to-ground detection block 73 terminates the sending of the cutoff signal Sc.

The detected operations outside the ASO indicate occurrences of the fault conditions of the power transistors. However, the ASO monitoring block 72 does not determine the type of the fault conditions. The first short-to-ground detection block 73 is aimed at reliable protection against a short to ground at the output terminal 3. Other fault detection blocks aimed at reliable protection against other types of the fault conditions may be included in the protection block 7. The other fault detection blocks may be activated by the ASO monitoring block 72 and perform the respective protections using the protection switch block 71 in a manner similar to the above-described manner of the first short-to-ground detection block 73.

The voltage level detector 8 includes a second short-to-ground detection block 81, a recovery block 82, and a cutoff signal generating block 83. The second short-to-ground detection block 81 monitors the voltage level $V_{STB}$ at the standby pin 5 and the voltage level $V_{out}$ of the output terminal 3, during power-up of the power amplifier 10. Upon detection of the voltage level $V_{STB}$ reaching a first threshold level $V_{th1}$ and a short to ground at the output terminal 3, the second short-to-ground detection block 81 activates its output to the cutoff signal generating block 83. The recovery block 82 monitors the voltage level $V_{STB}$ at the standby pin 5 during power-up of the power amplifier 10. Upon detection of the voltage level $V_{STB}$ reaching a second threshold level $V_{th2}$ beyond the first threshold $V_{th1}$ (i.e., $V_{th2} > V_{th1}$), the recovery block 82 activates its output to the cutoff signal generating block 83. The cutoff signal generating block 83 issues the cutoff signal Sc on activation of the input from the second short-to-ground detection block 81, and on the other hand, terminates the issue of the cutoff signal Sc on activation of the input from the recovery block 82.

The reaction time of the voltage level detector 8 activating the protection switch block 71 by the issue of the cutoff signal Sc is determined mainly by the time required for the voltage level $V_{STB}$ at the standby pin 5 to rise from 0V to the first threshold level $V_{th1}$. Setting the first threshold level $V_{th1}$ well below the level $V_{ON}$ at startup of the ASO monitoring block 72 can realize the prompt detection of the short to ground at an earlier stage during power-up of the power amplifier 10 in contrast to the prior art.

The reaction time of the voltage level detector 8 releasing the protection switch block 71 by the termination of the issue of the cutoff signal Sc is determined mainly by the time required for the voltage level $V_{STB}$ at the standby pin 5 to rise from the first threshold level $V_{th1}$ to the second threshold level $V_{th2}$. During the reaction time, the protection switch block 71 activates the first short-to-ground detection block 73. The second threshold level $V_{th2}$ is optimized for the prompt release of the protection switch block 71 and high reliability of the detection by the first short-to-ground detection block 73. Thereby, the power amplifier 10 promptly recovers the normal operation. Thus, the voltage level detector 8 avoids affecting the original performance of the power amplifier 10.

Figure 4:
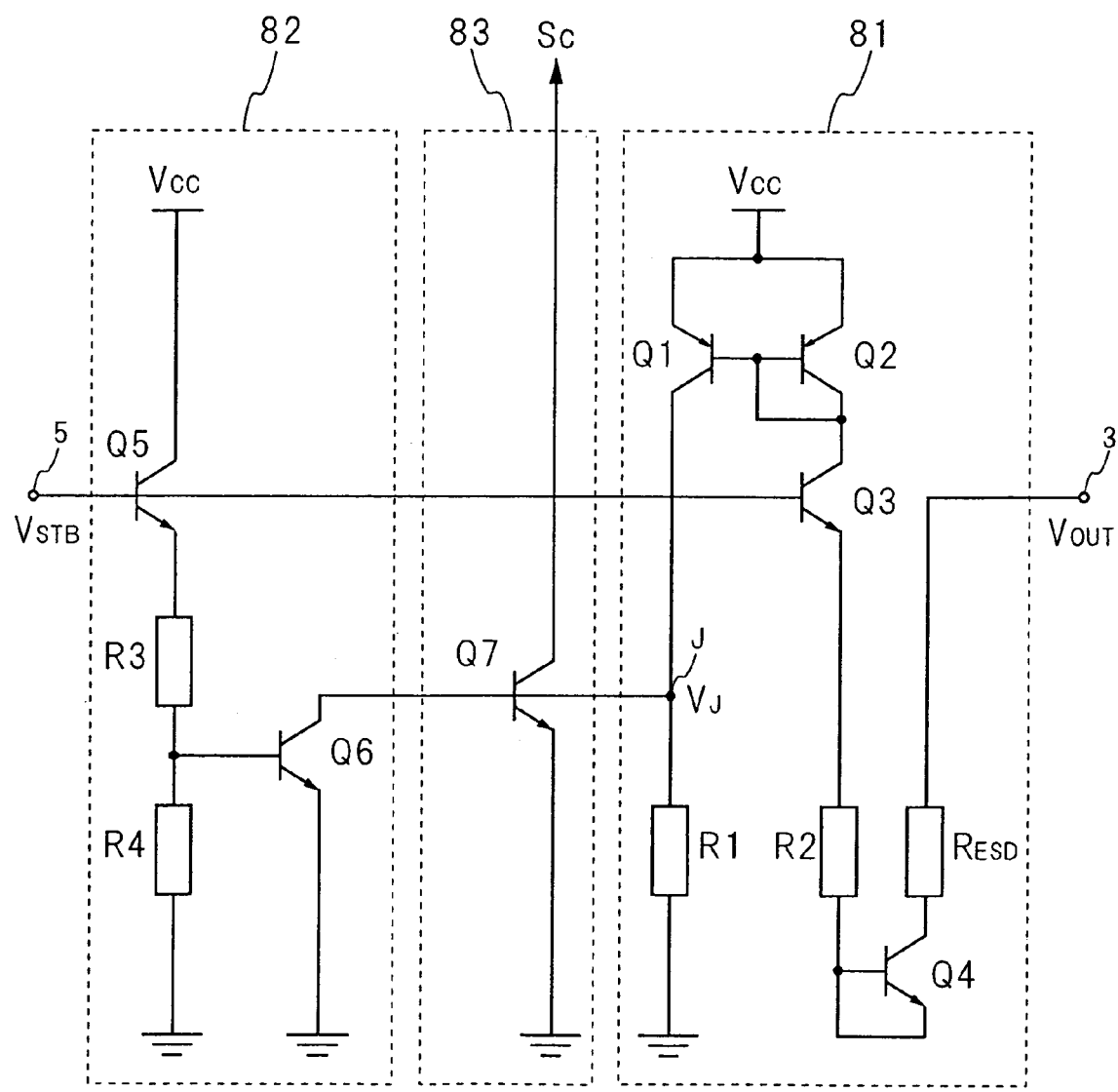
FIG. 4 is a circuit diagram showing a preferable example of a voltage level detector 8 of the power amplifier 10.

FIG. 4 shows a preferable example of a circuit diagram of the voltage level detector 8.

The second short-to-ground detection block 81 comprises two PNP transistors Q1 and Q2, two NPN transistors Q3 and Q4, two resistors R1 and R2, and an ESD (Electro-Static Discharge) resistor $R_{ESD}$. The emitters of the two PNP transistors Q1 and Q2 are connected to the power supply. The bases of the two PNP transistors Q1 and Q2 are connected to each other. The collector of the first PNP transistor Q1 is grounded through the first resistor R1. The base and collector of the second PNP transistor Q2 are connected to each other. Accordingly, the emitter currents of the two PNP transistors Q1 and Q2 are mirrored to each other. The ratio between the emitter currents is substantially equal to the ratio between the sizes of the two PNP transistors Q1 and Q2. The collector, base, and emitter of the first NPN transistor Q3 are connected to the collector of the second PNP transistor Q2, the standby pin 5, and the base of the second NPN transistor Q4 through the second resistor R2, respectively. The base and emitter of the second NPN transistor Q4 are connected to each other. The collector of the second NPN transistor Q4 is connected to the output terminal 3 through the ESD resistor $R_{ESD}$. The ESD resistor $R_{ESD}$ represents the resistance of a protection device against ESD at the output terminal 3, and accordingly, its resistance value is well below the resistance values of the other resistors R1 and R2.

During usual power-up, the voltage level $V_{OUT}$ at the output terminal 3 smoothly rises, and accordingly, the voltage level $V_{STB}$ at the standby pin 5 is slightly higher or lower than the voltage level $V_{OUT}$ at the output terminal 3. Then, the two NPN transistors Q3 and Q4 both maintain in the OFF states, and the voltage level $V_J$ at the junction J between the first PNP transistor Q1 and the first resistor R1 is substantially equal to 0V. When the voltage level $V_{STB}$ at the standby pin 5 is unusually higher than the voltage level $V_{OUT}$ at the output terminal 3, a forward voltage is applied across the second NPN transistor Q4, and then a sufficient amount of the base current flows through the first NPN transistor Q3. Thus, the two NPN transistors Q3 and Q4 both turns on, and then the voltage level $V_J$ at the junction J between the first PNP transistor Q1 and the first resistor R1 rises. The voltage $V_{STB} - V_{OUT}$ between the standby pin 5 and the output terminal 3 is given by the following equation (1):

$$V_{STB} - V_{OUT} = V_{BE3} + V_{BC4} + \frac{A_2}{A_1} \frac{R2 + R_{ESD}}{R1} V_J, \quad (1)$$

where, $V_{BE3}$ is the base-emitter voltage of the first NPN transistor Q3 in the ON state, $V_{BC4}$ is the base-collector voltage of the second NPN transistor Q4 in the ON state, and $A_1/A_2$ is the size ratio between the two PNP transistors Q1 and Q2. (The resistance values of the three resistors R1, R2, and $R_{ESD}$ are represented by the same reference symbols.)

The recovery block 82 comprises two NPN transistors Q5 and Q6, and two resistors R3 and R4. The collector, base, and emitter of the third NPN transistor Q5 are connected to the power supply, the standby pin 5, and a ground through the two series resistors R3 and R4, respectively. The collector, base, and emitter of the fourth NPN transistor Q6 are connected to the junction J between the first PNP transistor Q1 and the first resistor R1, the junction between the two resistors R3 and R4, and a ground, respectively.

During power-up, the voltage level $V_{STB}$ at the standby pin 5 rises and the base current of the third NPN transistor Q5 increases. When the third NPN transistor Q5 turns on because of a sufficient amount of the base current, the fourth NPN transistor Q6 also turns on because of the significant increase of its base current. Then, the voltage level $V_J$ at the junction J between the first PNP transistor Q1 and the first resistor R1 drops to 0V. At that time, the voltage level $V_{STB}$ at the standby pin 5 is given by the following equation (2):

$$V_{STB} = V_{BE5} + \frac{R3 + R4}{R4} V_{BE6}, \quad (2)$$

where, $V_{BE5}$ and $V_{BE6}$ are the base-emitter voltages of the two NPN transistor Q5 and Q6 in the ON states, respectively. (The resistance values of the two resistors R3 and R4 are represented by the same reference symbols.)

The cutoff signal generating block 83 comprises a fifth NPN transistor Q7. The collector, base, and emitter of the fifth NPN transistor Q7 are connected to the protection switch block 71 (see FIG. 2), the junction J between the first PNP transistor Q1 and the first resistor R1, and a ground, respectively. Moreover, the collector of the fifth NPN transistor Q7 is pulled up to a predetermined positive potential (not shown). When the voltage level $V_J$ at the junction J rises, the fifth NPN transistor Q7 turns on because of the significant increase of its base current. Then, the collector-emitter voltage of the fifth NPN transistor Q7 drops. The protection switch block 71 detects the voltage drop as activation of the cutoff signal Sc. When the voltage level $V_J$ at the junction J drops, the fifth NPN transistor Q7 turns off. Then, the potential at the collector of the fifth NPN transistor Q7 is pulled up to the original high level. The protection switch block 71 detects the pull-up as deactivation of the cutoff signal Sc.

In the event of a short to ground at the output terminal 3 during power-up, the voltage level $V_{OUT}$ at the output terminal 3 stays at a low level substantially equal to 0V, while the voltage level $V_{STB}$ at the standby pin 5 rises. In that case, the activation of the cutoff signal Sc, that is, the turn-on of the fifth NPN transistor Q7 requires the voltage level $V_{STB}$ at the standby pin 5 to exceed the first threshold level $V_{th1}$, which is given by the following equation (3) based on the equation (1):

$$V_{STB} \geq V_{th1} = V_{BE3} + V_{BC4} + \frac{A_2}{A_1} \frac{R2 + R_{ESD}}{R1} V_{BE7}, \qquad (3)$$

where $V_{BE7}$ is the base-emitter voltage of the fifth NPN transistor Q7 in the ON state. As clearly understood from the equation (3), the reaction time of the voltage level detector 8 activating the protection switch block 71 can be optimized by the size ratio $A_1/A_2$ between the two PNP transistors Q1 and Q2, and the resistance ratio between the two resistors R1 and R2. Here, the ESD resistor $R_{ESD}$ has so small resistance value that its existence has little influence on the response time of the voltage level detector 8.

The deactivation of the cutoff signal Sc, that is, the turn-off of the fifth NPN transistor Q7 requires the voltage level $V_{STB}$ at the standby pin 5 to exceed the second threshold level $V_{th2}$, which is given by the above-described equation (2):

$$V_{STB} \geq V_{th2} = V_{BE5} + \frac{R3 + R4}{R4} V_{BE6} > V_{th1}. \qquad (4)$$

As easily understood by the equation (4), the response time of the voltage level detector 8 releasing the protection switch block 71 can be optimized by the resistance ratio between the two resistors R3 and R4.

In normal operation without any fault occurrence, the fifth NPN transistor Q7 is unable to activate the protection switch block 71. Moreover, the voltage level $V_J$ at the junction J stays at 0V, and accordingly, the two NPN transistors Q3 and Q4 have high impedances at the output terminal 3. As such, the voltage level detector 8 avoids affecting the original performance of the power amplifier 10 in normal operation.

The protection block 7 with the above-described configuration performs protection for the power amplifier 10 as follows.

Figure 5:
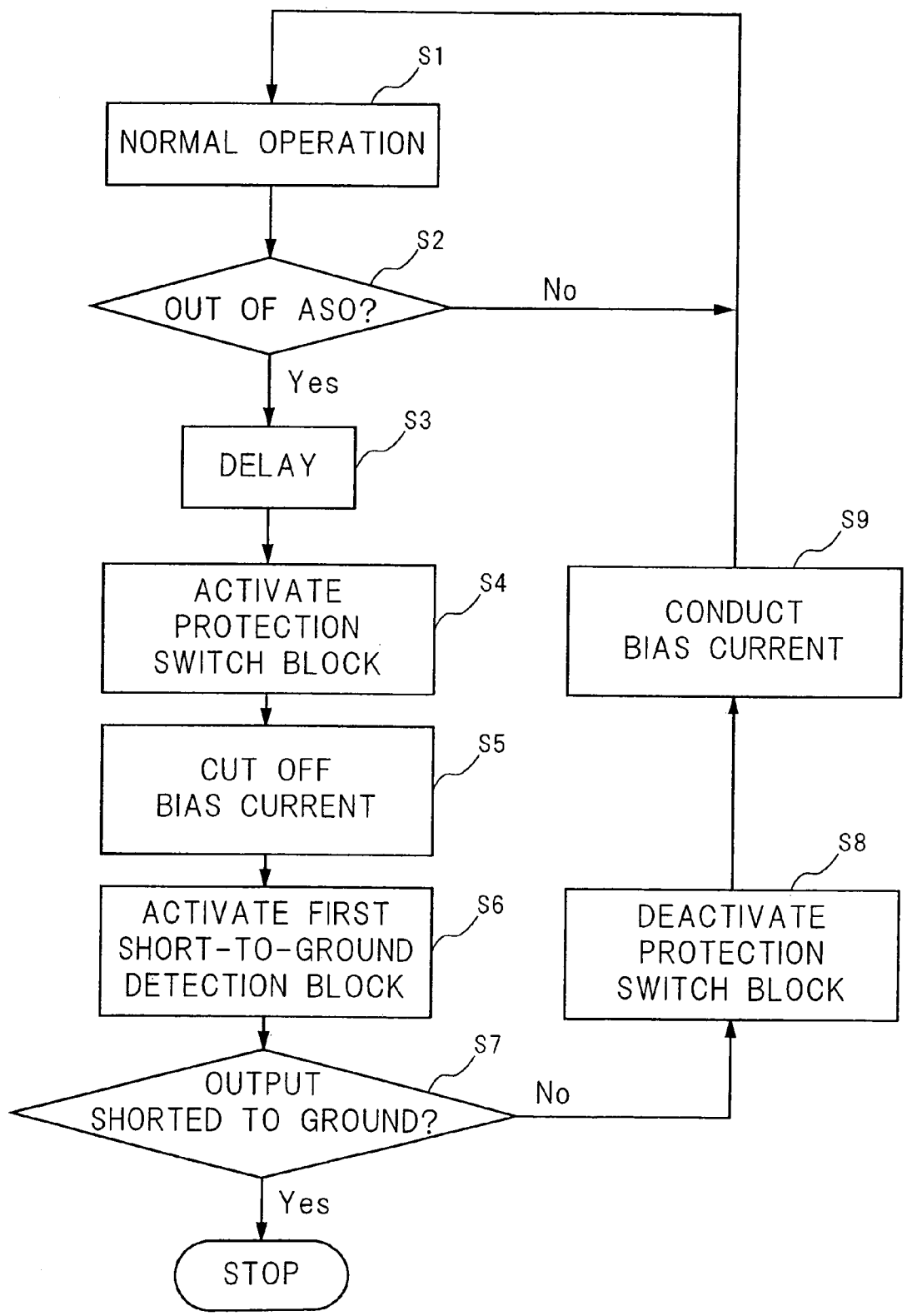
FIG. 5 is a flow chart showing the protection for the power amplifier 10 in normal operation.

FIG. 5 shows a flow chart of the protection for the power amplifier 10 in normal operation.

<Step S1>
During normal operation, the standby pin 5 stays active, and then the ASO monitoring block 72 biased in the activated state detects the currents, voltages, and temperatures of the power transistors.

<Step S2>
The ASO monitoring block 72 is determined the limits of the ASO based on the detected temperature. In case where the detected current or voltage exceeds the limits of the ASO, the process proceeds to the next Step S3, otherwise repeats Step S1.

<Step S3 and S4>
After a wait of the delay time $T_D$, the ASO monitoring block 72 sends the cutoff signal Sc to the protection switch block 71, thereby activating the protection switch block 71 without misoperations due to abrupt variations in currents and voltages.

<Step S5>
The protection switch block 71 turns off the protection switches 7A, thereby cutting off the bias currents from the bias block 4 to the output block 2. Then, the power transistors are both confined in the OFF states.

<Step S6>
The protection switch block 71 issues the startup signal Ss, thereby connecting the first short-to-ground detection block 73 to the bias block 4. Then, the first short-to-ground detection block 73 is activated and monitors the potential of the output terminal 3 with respect to the ground. (Likewise other fault detection blocks in the protection block 7.)

<Step S7>
In the event of a short to ground at the output terminal 3, the first short-to-ground detection block 73 continues to send the cutoff signal Sc to the protection switch block 71. (Likewise other fault detection blocks in the protection block 7.) Thereby, the protection switch block 71 maintains the protection switches 7A in the OFF states. Thus, the power amplifier 10 stops the normal operation and the power transistors avoid permanent damage due to an overcurrent. When the short to ground is not detected or removed, the process branches Step S8.

<Step S8 and S9>
The first short-to-ground detection block 73 terminates the issue of the cutoff signal Sc. (Likewise other fault detection blocks in the protection block 7.) Then, the protection switch block 71 is deactivated and the protection switches 7A turn on, thereby allowing the bias currents to flow to the output block 2. Thus, the power transistors are released and the power amplifier 10 recovers the normal operation.

Figure 6:
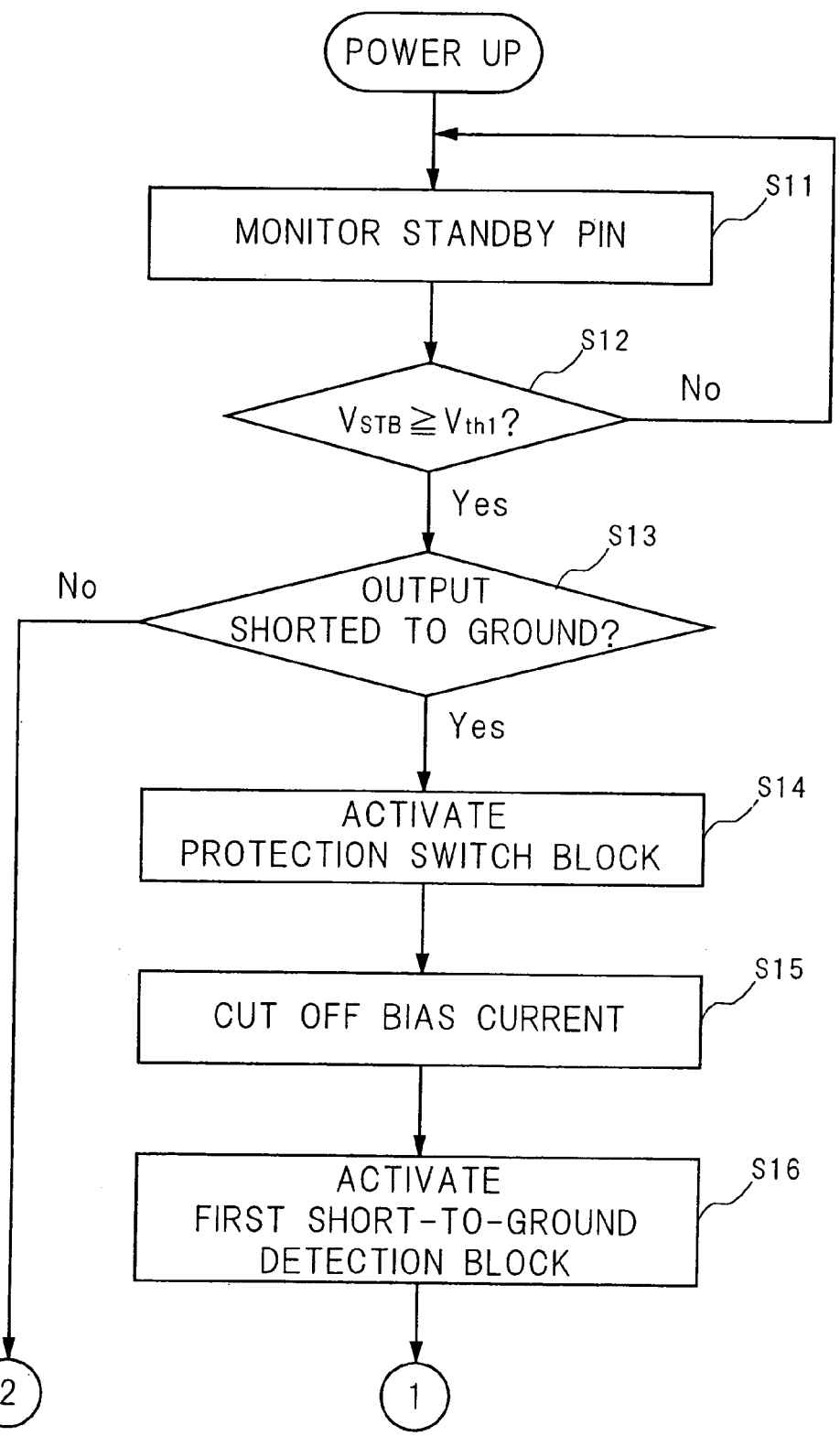
FIG. 6 is a flow chart showing the first part of the protection for the power amplifier 10 during power-up.
Figure 7:
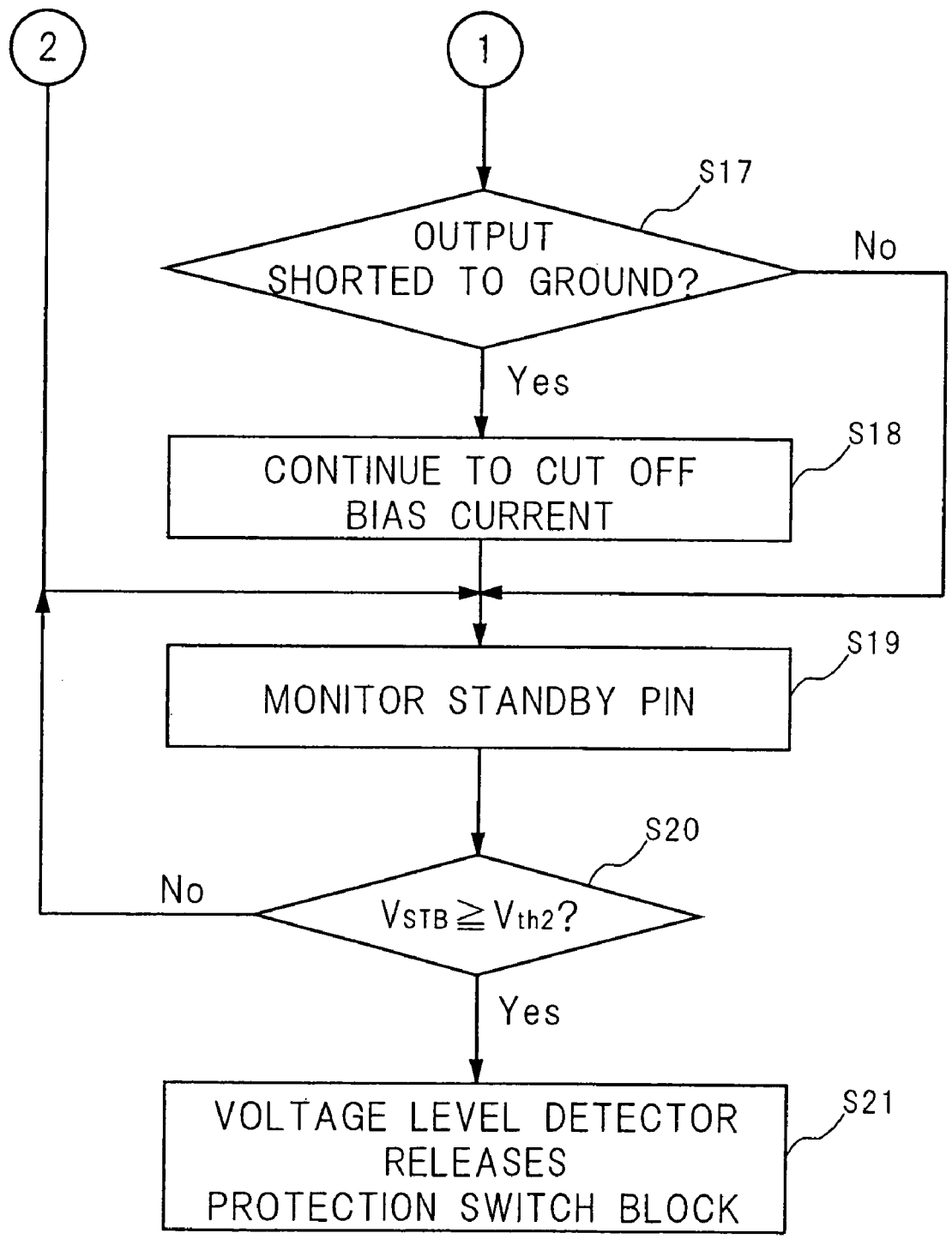
FIG. 7 is a flow chart showing the second part of the protection for the power amplifier 10 during power-up.
Figure 8:
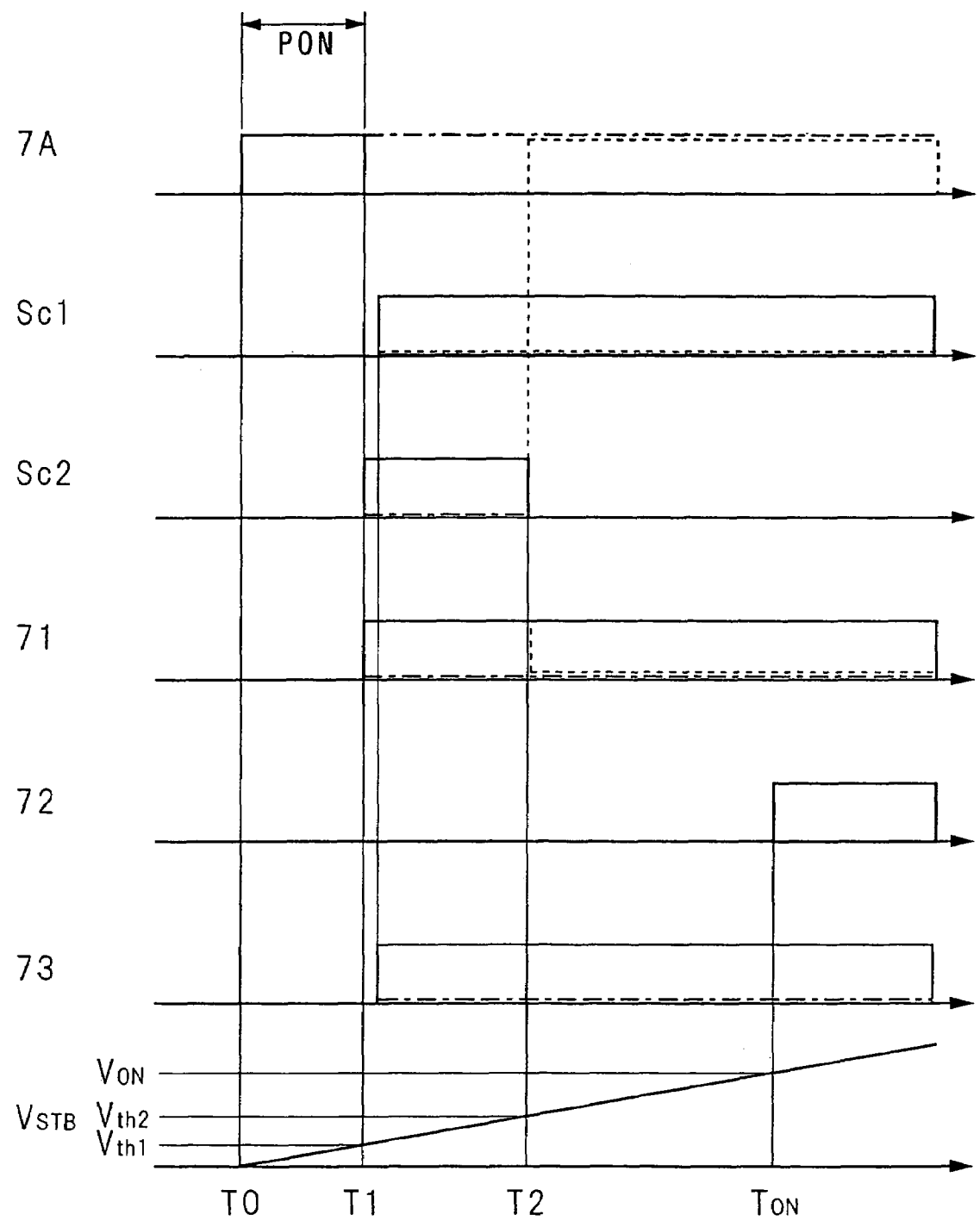
FIG. 8 is a timing chart during power-up showing the operations of protection switches 7A, a protection switch block 71, an ASO monitoring block 72, and a first short-to-ground detection block 73 in the power amplifier 10, and variations of two cutoff signals Sc1 and Sc2 issued by the first short-to-ground detection block 73 and the voltage level detector 8, respectively, and the voltage level $V_{STB}$ at the standby pin 5.
Figure 9:
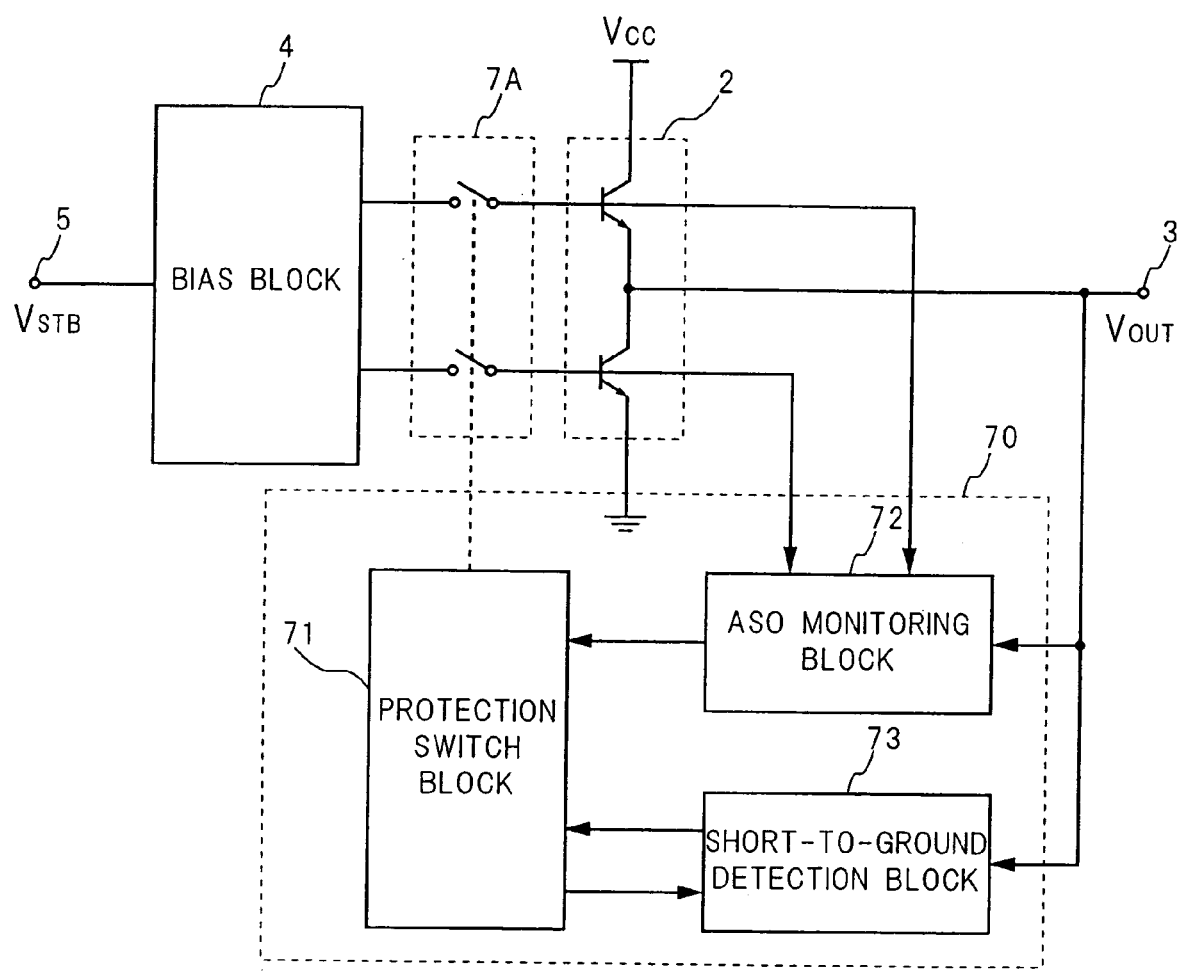
FIG. 9 is a block diagram showing the protection for a conventional audio power amplifier.
Figure 10:
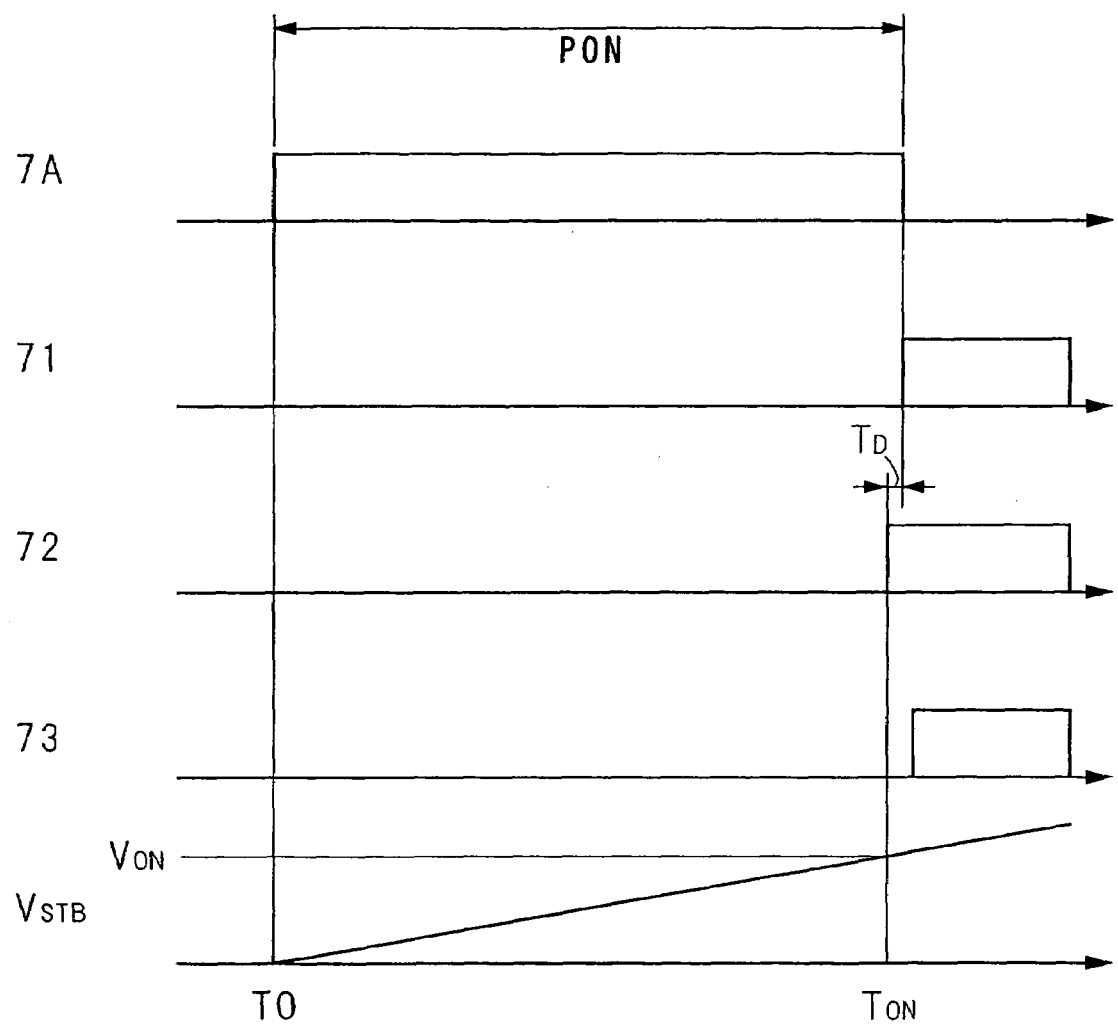
FIG. 10 is a timing chart during power-up showing the operations of protection switches 7A, a protection switch block 71, an ASO monitoring block 72, and a short-toground detection block 73 in the conventional audio power amplifier shown in FIG. 9, together with the voltage level $V_{STB}$ at the standby pin 5.

FIGS. 6 and 7 show a flow chart of the protection for the power amplifier 10 during power-up. FIG. 8 shows timing of the operations of the protection switches 7A, the protection switch block 71, the ASO monitoring block 72, and the first short-to-ground detection block 73 during power-up. FIG. 8 also shows timing charts for the two cutoff signals Sc1 and Sc2 issued by the first short-to-ground detection block 73 and the voltage level detector 8, respectively, and the voltage level $V_{STB}$ at the standby pin 5. In FIG. 8, high (or low) levels represent activated (or non-activated) states of the respective blocks. (Note that the cutoff signal Sc2 issued by the voltage level detector 8 is active-low in the above-described example and FIG. 4.)

As shown in FIG. 8, the voltage level $V_{STB}$ at the standby pin 5 rises at a predetermined rate from 0V, starting at the time T0 when power-up starts. The bias block 4 monitors the voltage level $V_{STB}$ during power-up, and does not provide the bias currents for the ASO monitoring block 72 until the standby pin 5 is activated, that is, the voltage level $V_{STB}$ reaches the level $V_{ON}$. Accordingly, the ASO monitoring block 72 cannot operate until the time $T_{ON}$ when the voltage level $V_{STB}$ reaches the level $V_{ON}$. On the other hand, the voltage level detector 8 operates at power-up, and thereby the protection for the output block 7 during power-up is performed as follows.

<Step S11 and S12>

The voltage level detector 8 monitors the voltage level $V_{STB}$ at the standby pin 5 and the voltage level $V_{out}$ of the output terminal 3 until the time T1 when the voltage level $V_{STB}$ reaches the first threshold level $V_{th1}$. Here, the protection switches 7A are maintained in the ON state.

<Step S13>

At the time T1, the voltage level $V_{STB}$ reaches the first threshold level $V_{th1}$. When the second short-to-ground detection block 81 in the voltage level detector 8 detects a short to ground at the output terminal 3 at the time T1, the process proceeds to Step S14, otherwise branches Step S18.

<Step S14>

The voltage level detector 8 sends the cutoff signal Sc2 to the protection switch block 71, that is, activates the cutoff signal Sc, thereby activating the protection switch block 71. Here, the cutoff signal Sc2 may be issued after a delay time for avoiding misoperations due to abrupt variations in currents and voltages.

<Step S15>

The protection switch block 71 turns off the protection switches 7A, thereby cutting off the bias currents from the bias block 4 to the output block 2. Then, the power transistors are both confined in the OFF states.

<Step S16>

The protection switch block 71 issues the startup signal Ss, thereby connecting the first short-to-ground detection block 73 to the bias block 4. Then, the first short-to-ground detection block 73 is activated immediately after the time T1, then monitoring the potential of the output terminal 3 with respect to the ground.

<Step S17 and S18>

In the event of a short to ground at the output terminal 3, the first short-to-ground detection block 73 continues to send the cutoff signal Sc1 to the protection switch block 71 (see the solid line shown in FIG. 8). Thereby, the protection switch block 71 maintains the protection switches 7A in the OFF states. When the short to ground is not detected or removed, the first short-to-ground detection block 73 terminates the sending of the cutoff signal Sc1 (see the broken line shown in FIG. 8).

<Step S19 and S20>

The voltage level detector 8 further monitors the voltage level $V_{STB}$ at the standby pin 5 until the time T2 when the voltage level $V_{STB}$ reaches the second threshold level $V_{th2}$. Here, after the time T1, the voltage level detector 8 continues to issue the cutoff signal Sc2 to maintain the protection switches 7A in the OFF state in the case where the second short-to-ground detection block 81 detects a short to ground at the output terminal 3 at Step S13 as indicated by solid lines in FIG. 8. Otherwise, the voltage level detector 8 terminates the issue of the cutoff signal Sc2, and then the protection switches 7A are maintained in the OFF state as indicated by alternate long and short dashed lines in FIG. 8.

<Step S21>

At the time T2, the voltage level $V_{STB}$ reaches the second threshold level $V_{th2}$. Then, the recovery block 82 in the voltage level detector 8 terminates the issue of the cutoff signal Sc2, thereby releasing the protection switch block 71, regardless of the fault occurrence.

In the case where the first short-to-ground detection block 73 is activated at Step S16 and detects a short to ground at the output terminal 3 at Step S17, the first short-to-ground detection block 73 continues to issue the cutoff signal Sc1 as indicated by solid lines in FIG. 8. Accordingly, after the time T2, the protection switch block 71 is maintained active and the protection switches 7A are maintained in the OFF state. Thus, in the event of a short to ground at the output terminal 3 during power-up, the voltage level detector 8 can activate the protection switch block 71, then cutting off the power transistor from the bias block 4 at the earlier stage of power-up. In particular, the ON time PON of the protect switches 7A immediately after the time T0 is greatly reduced, and therefore, the output block 2 can be protected against permanent damages due to a short to ground at the output terminal 3 during power-up.

In the case where the first short-to-ground detection block 73 is activated at Step S16 but does not detect a short to ground at the output terminal 3 at Step S17, the first short-to-ground detection block 73 does not issue the cutoff signal Sc1 as indicated by broken lines in FIG. 8. Accordingly, at the time T2, the protection switch block 71 is deactivated and the protection switches 7A turn on. Therefore, the power amplifier 10 promptly recovers the normal power-on operation. Thus, the voltage level detector 8 avoids affecting the original performance of the power amplifier 10.

In the above-described embodiment of the present invention, the voltage level detector 8 includes the second short-to-ground detection block 81 aimed at protection against a short to ground at the output terminal 3. Other fault detection blocks aimed at protection against other types of the fault conditions during power-up may be included in the voltage level detector 8. The other fault detection blocks may activate themselves through monitoring the voltage level $V_{STB}$ at the standby pin 5 and perform the respective protections using the protection switch block 71 at an earlier stage of power-up, in a manner similar to the above-described manner of the second short-to-ground detection block 81.

The above-described disclosure of the invention in terms of the presently preferred embodiments is not to be interpreted as intended for limiting. Various alterations and modifications will no doubt become apparent to those skilled in the art to which the invention pertains, after having read the disclosure. As a corollary to that, such alterations and modifications apparently fall within the true spirit and scope of the invention. Furthermore, it is to be understood that the appended claims be intended as covering the alterations and modifications.

The invention claimed is:

1. A power amplifier comprising:
   an output block including power transistor and an output terminal connected to a load;
   a bias block including a standby pin and being allowed to bias other blocks of the power amplifier in activated states, especially the power transistor conductive, when the standby pin stays active;

a voltage level detector including:
- a fault detecting block for monitoring the voltage level at the standby pin during power-up, and upon detection of the voltage level reaching a threshold level, detecting fault conditions of the power transistor and the output terminal; and
- a cutoff signal generating block for issuing the cutoff signal when the fault detection block detects a fault condition of one of the power transistor and the output terminal;
- a protection switch block for cutting off the output block from the bias block and connecting the fault detection block to the bias block during reception of the cutoff signal,
- wherein the voltage level detector includes a recovery block for monitoring the voltage level at the standby pin during power-up, and upon detection of the voltage level reaching a second threshold level, causing the cutoff signal generating block to terminate issue of the cutoff signal.

2. A voltage level detector for protection control of a power amplifier comprising:
- an output block including a power transistor and an output terminal connected to a load; a bias block including a standby pin and being allowed to bias other blocks of the power amplifier in activated states, especially the power transistor conductive, when the standby pin stays active;
- an Area-of-Safe-Operation monitoring block for detecting the operation of the power transistor outside their Area of Safe Operation and issuing a cutoff signal;
- a first fault detection block for detecting fault conditions of the power transistor and the output terminal and issuing the cutoff signal; and
- a protection switch block for cutting off the output block from the bias block and connecting the first fault detection block to the bias block during reception of the cutoff signal;
- said voltage level detector comprising:
- a second fault detection block for monitoring the voltage level at the standby pin during power-up, and upon detection of the voltage level reaching a threshold level, detecting fault conditions of the power transistor and the output terminal; and
- a cutoff signal generating block for issuing the cutoff signal when the second fault detection block detects a fault condition of one of the power transistor and the output terminal,
- wherein said second fault detection block monitors a voltage, a current or a combination of voltage and current, or any power conditions.

3. A power amplifier comprising:
- an output block including power transistor and an output terminal connected to a load;
- a bias block including a standby pin and being allowed to bias other blocks of the power amplifier in activated states, especially the power transistor conductive, when the standby pin stays active;
- an Area-of-Safe-Operation monitoring block for detecting the operation of the power transistor outside their Area of Safe Operation and issuing a cutoff signal;
- a first fault detection block for detecting fault conditions of the power transistor and the output terminal and issuing the cutoff signal; and
- a protection switch block for cutting off the output block from the bias block and connecting the first fault detection block to the bias block during reception of the cutoff signal; and
- a voltage level detector including:
  - a second fault detection block for monitoring the voltage level at the standby pin during power-up, and upon detection of the voltage level reaching a threshold level, detecting fault conditions of the power transistor and the output terminal; and
  - a cutoff signal generating block for issuing the cutoff signal when the second fault detection block detects a fault condition of one of the power transistor and the output terminal,
- wherein said second fault detection block monitors a voltage, a current or a combination of voltage and current, or any power conditions.

4. The power amplifier according to claim 1, wherein said fault detection block monitors a voltage, a current or a combination of voltage and current, or any power conditions.

5. A voltage level detector for protection control of a power amplifier comprising:
- an output block including a power transistor and an output terminal connected to a load;
- a bias block including a standby pin and being allowed to bias other blocks of the power amplifier in activated states, especially the power transistor conductive, when the standby pin stays active;
- an Area-of-Safe-Operation monitoring block for detecting the operation of the power transistor outside their Area of Safe Operation and issuing a cutoff signal;
- a first fault detection block for detecting fault conditions of the power transistor and the output terminal and issuing the cutoff signal; and
- a protection switch block for cutting off the output block from the bias block and connecting the first fault detection block to the bias block during reception of the cutoff signal;
- said voltage level detector comprising:
- a second fault detection block for monitoring the voltage level at the standby pin during power-up, and upon detection of the voltage level reaching a threshold level, detecting fault conditions of the power transistor and the output terminal; and
- a cutoff signal generating block for issuing the cutoff signal when the second fault detection block detects a fault condition of one of the power transistor and the output terminal,
- wherein said second fault detection block detects output short to ground, output short to VCC, or any other fault conditions during power up.

6. A power amplifier comprising:
- an output block including power transistor and an output terminal connected to a load;
- a bias block including a standby pin and being allowed to bias other blocks of the power amplifier in activated states, especially the power transistor conductive, when the standby pin stays active;
- an Area-of-Safe-Operation monitoring block for detecting the operation of the power transistor outside their Area of Safe Operation and issuing a cutoff signal;
- a first fault detection block for detecting fault conditions of the power transistor and the output terminal and issuing the cutoff signal; and a protection switch block for cutting off the output block from the bias block and connecting the first fault detection block to the bias block during reception of the cutoff signal; and a voltage level detector including:
  a second fault detection block for monitoring the voltage level at the standby pin during power-up, and upon detection of the voltage level reaching a threshold level, detecting fault conditions of the power transistor and the output terminal; and
  a cutoff signal generating block for issuing the cutoff signal when the second fault detection block detects a fault condition of one of the power transistor and the output terminal, wherein said second fault detection block detects output short to ground, output short to VCC, or any other fault conditions during power up.

7. The power amplifier according to claim 1, wherein said fault detection block detects output short to ground, output short to VCC, or any other fault conditions during power up.

8. A power amplifier comprising:

an output block including power transistor and an output terminal connected to a load;

a bias block to bias other blocks of the power amplifier in activated states, especially the power transistor conductive;

a fault detection block is operable to detect any fault conditions during power up;

a cutoff signal generating block for issuing the cutoff signal when the fault detection block detects a fault condition;

a protection switch block for cutting off the output block from the bias block and/or deactivate the bias block during reception of the cutoff signal; and a recovery block causing the cutoff signal generating block to terminate issue of the cutoff signal when the fault detection block detects a removal of the fault condition.

* * * * *